US005234715A

United States Patent [19]

Stevens et al.

[11] Patent Number: 5,234,715

[45] Date of Patent: Aug. 10, 1993

[54] METHOD OF MAKING GALVANICALLY DISSIPATABLE EVANESCENT CHAFF FIBER

[75] Inventors: Ward C. Stevens, New Fairfield; Edward A. Sturm, New Milford; Delwyn F. Cummings, Meriden, all of Conn.

[73] Assignee: Advanced Technology Materials, Inc., Danbury, Conn.

[21] Appl. No.: 742,640

[22] Filed: Aug. 7, 1991

Related U.S. Application Data

[62] Division of Ser. No. 449,708, Dec. 11, 1989, Pat. No. 5,039,990.

[51] Int. Cl.[5] .......... C23C 16/00

[52] U.S. Cl. .......... 427/250; 427/124; 427/123; 427/404; 427/405; 427/343; 205/122; 205/162; 205/164; 205/184; 205/186

[58] Field of Search .......... 427/250, 248.1, 124, 427/405, 404, 113, 123, 343, 337, 304, 305; 205/112, 181, 182, 184, 186, 162, 122, 164

[56] References Cited

U.S. PATENT DOCUMENTS

| | | | |
|---|---|---|---|
| 2,682,783 | 2/1954 | Drummond | 18/54 |
| 2,920,981 | 1/1960 | Whitehurst | 427/404 |
| 3,097,941 | 7/1963 | Toulmin, Jr. | 65/3 |
| 3,129,487 | 4/1964 | Whitacre et al. | 18/75 |
| 3,221,875 | 12/1965 | Paquette | 206/65 |
| 3,544,997 | 12/1970 | Turner et al. | 343/18 |
| 3,549,412 | 12/1970 | Frye et al. | 427/217 |
| 3,725,927 | 3/1973 | Fiedler | 343/18 |
| 3,765,931 | 10/1973 | Kyri et al. | 428/450 |
| 3,811,934 | 5/1974 | Glaser | 205/186 |
| 3,812,566 | 5/1974 | Clauss | 428/613 |
| 3,952,307 | 4/1976 | Nagler | 343/18 |
| 4,568,413 | 2/1986 | Toth et al. | 156/151 |
| 4,759,950 | 7/1988 | Stevens | 427/55 |
| 4,852,453 | 8/1989 | Morin | 89/1.11 |

OTHER PUBLICATIONS

Butters, Bryan C. F., "Electronic Countermeasures/-Chaff" IEEE Proceedings, vol. 129, Part E, No. 3, Jun. 1982, pp. 197-201.

Potter, E. C. Electrochemistry, McMillan Company, New York, 1961, pp. 233-237.

*Primary Examiner*—Roy King

*Attorney, Agent, or Firm*—Steven J. Hultquist

[57] ABSTRACT

An article comprising a non-conductive substrate having a sub-micron thickness of an oxidizable conductive first metal coating thereon, and a second (promoter) metal which is galvanically effective to promote the corrosion of the first metal, discontinuously coated on the first metal coating. Optionally, the second metal-doped, first metal-coated substrate may be further coated with a salt, to accelerate the galvanic corrosion reaction by which the conductive first metal coating is oxidized. Also disclosed is a related method of forming such articles, comprising chemical vapor depositing the first metal on the substrate and chemical vapor depositing the second metal on the applied first metal coating, and of optionally applying a salt by salt solution contacting of the second metal-doped, first metal-coated substrate. When utilized in a form comprising fine-diameter substrate elements such as glass or ceramic filaments, the resulting product may be usefully employed as an evanescent chaff. In the presence of atmospheric moisture, such evanescent chaff undergoes oxidation of the first metal coating so that the radar signature of the chaff transiently decays.

19 Claims, 4 Drawing Sheets

METHOD OF MAKING GALVANICALLY DISSIPATABLE EVANESCENT CHAFF FIBER

CROSS-REFERENCE TO RELATED APPLICATIONS

This application is a division of U.S. application Ser. No. 07/449,708 filed Dec. 11, 1989 and to issue on Aug. 13, 1991 as U.S. Pat. No. 5,039,990. U.S. application Ser. No. 07/449,708 was co-filed with the following related applications, all assigned to the assignee hereof: U.S. application Ser. No. 07/448,252 filed Dec. 11, 1989, now U.S. Pat. No. 5,034,274, in the names of Ward C. Stevens, Edward A. Sturm, and Bruce C. Roman, for "SALT-DOPED CHAFF FIBER HAVING AN EVANESCENT ELECTROMAGNETIC DETECTION SIGNATURE, AND METHOD OF MAKING THE SAME"; U.S. application Ser. No. 07/450,585 filed Dec. 11, 1989, now abandoned in the names of Ward C. Stevens, Edward A. Sturm and Bruce C. Roman for "SULFURIZED CHAFF FIBER HAVING AN EVANESCENT RADAR REFLECTANCE CHARACTERISTIC, AND METHOD OF MAKING THE SAME"; and U.S. application Ser. No. 07/449,695 filed Dec. 11, 1989, now U.S. Pat. No. 5,087,515, in the names of Ward C. Stevens, Edward A. Sturm and Bruce C. Roman for "CHAFF FIBER COMPRISING INSULATIVE COATING THEREON, AND HAVING AN EVANESCENT RADAR REFLECTANCE CHARACTERISTIC, AND METHOD OF MAKING THE SAME".

BACKGROUND OF THE INVENTION

1. Field of the Invention

This invention relates to chaff with a transient radar reflectance characteristic, having utility as an electronic warfare countermeasure useful as an electromagnetic detection decoy or for anti-detection masking of an offensive attack.

2. Description of the Related Art

In modern warfare, a wide variety of weapons systems are employed which operate across the electromagnetic spectrum, including radio waves, microwaves, infrared signals, ultraviolet signals, x-rays, and gamma rays.

To counter such weapons systems, smoke and other obscurants have been deployed. In the past, smoke has been variously employed as a means of protection of ground-based military vehicles and personnel during conflict, to blind enemy forces, to camouflage friendly forces, and to serve as decoys to divert hostile forces away from the positions of friendly forces. With the evolution of radar guided missiles and increasing use of radar systems for battlefield surveillance and target acquisition, the obscurant medium must provide signal response in the millimeter wavelengths of the electromagnetic spectrum.

The use of "chaff", viz., strips, fibers, particles, and other discontinuous-form, metal-containing media to provide a signal response to radar, began during World War II. The first use of chaff involved metal strips about 300 millimeters long and 15 millimeters wide, which were deployed in units of about 1,000 strips. These chaff units were manually dispersed into the air from flying aircraft, to form chaff "clouds" which functioned as decoys against radars operating in the frequency range of 490-570 Megahertz.

Chaff in the form of aluminum foil strips has been widely used since World War II. More recent developments in chaff technology include the use of aluminum-coated glass filament and silver-coated nylon filament.

In use, chaff elements are formed with dimensional characteristics creating dipoles of roughly one-half the wavelength of the hostile electromagnetic system. The chaff is dispersed into a hostile radar target zone, so that the hostile radar "locks onto" the signature of the chaff dispersion. The chaff is suitably dispersed into the air from airborne aircraft, rockets or warheads, or from ground-based deployment systems.

The chaff materials which have been developed to date function effectively when deployed at moderate to high altitudes, but are generally unsatisfactory as obscuration media in proximity to the ground due to their high settling rates. Filament-type chaff composed of metal-coated fibers may theoretically be fashioned with properties superior to metal strip chaff materials, but historically the "hang time" (time aloft before final settling of the chaff to the ground) is unfortunately still too low to accommodate low altitude use of such chaff. This high settling rate is a result of large substrate diameters necessary for standard processes, typically on the order of 25 microns, as well as thick metal coatings which increase overal density. A further problem with metallized filaments is that typical metal coatings, such as aluminum, remain present and pose a continuing electrical hazard to electrical and electronic systems after the useful life of the chaff is over.

It would therefore be a substantial advance in the art to provide a chaff material which is characterized by a reduced settling rate and increased hang time, as compared with conventional chaff materials, and which overcomes the persistance of adverse electrical characteristics which is a major disadvantage of conventional chaff materials.

Accordingly, it is an object of the present invention to provide an improved chaff material which overcomes such difficulties.

It is another object of the present invention to provide a chaff material having an evanescent metal component with an evanescent electromagnetic detection signature.

It is another object of the present invention to provide a chaff material whose evanescent electronic signature may be selectively adjusted so that the chaff material is transiently active for a predetermined time, consistent with its purpose and its locus of use.

Other objects and advantages of the present invention will be more fully apparent from the ensuing disclosure and appended claims.

SUMMARY OF THE INVENTION

In one aspect, the present invention relates to an article comprising a non-conductive substrate having a sub-micron thickness of an oxidizable conductive first metal coated thereon, and a second metal which promotes galvanic corrosion of the first metal, discontinuously applied on the first metal coating. The first metal coating preferably is substantially continuous in character.

In another aspect the present invention relates to an article comprising a non-conductive substrate having a sub-micron thickness of an oxidizable conductive first metal coated thereon, a second metal which promotes galvanic corrosion of the first metal coating, discontinuously applied on the first metal coating, and a salt overcoated thereon.

The salt may for example comprise from about 0.005 to about 25% by weight, based on the weight of the oxidizable first metal, of a metal salt or organic salt, the specific amount of the salt employed being enhancingly effective for oxidization of the oxidizable first metal coating, as promoted by the second metal discontinuously coated on the first metal.

The oxidizable first metal may suitably be any metal species or combination of metal species which is compatible with the substrate and other components of the article, and appropriate to the end-use application of the coated product article. Suitable metals may for example be selected from the group consisting of iron, copper, zinc, tin, nickel, and combinations thereof.

In chaff applications, the oxidizable metal preferably is iron.

The non-conductive substrate may be formed from any of a wide variety of materials, including glasses, polymers, pre-oxidized carbon, non-conductive carbon, and ceramics, with glasses, particularly oxide glasses, and specifically silicate glasses, generally being preferred. For chaff applications, the substrate preferably is in the form of a filament, which may for example be on the order of 0.5 to about 25 microns in diameter and preferably from about 2 to about 15 microns in diameter.

The second metal discontinuously coated on the first metal coating may comprise any of various suitable metals, depending on the character of the first metal coating. Illustrative second metal species which may be potentially suitable in the broad practice of the present invention include cadmium, cobalt, nickel, tin, lead, copper, mercury, silver, and gold, with copper being generally preferred due to its low toxicity, low cost, and low oxidation potential. It is to be recognized, of course, that the second metal species is selected to provide a galvanically active combination for purposes of achieving corrosion of the conductive first metal coating, to yield non-conductive corrosion products therefrom. Accordingly, the second metal is different from the first metal.

The salt coating may be formed of any of various suitable salts, including metal halide, metal sulfate, metal nitrate, and organic salts. Preferably the salt is a metal halide salt, whose halide constituent is chlorine.

In chaff applications, wherein the chaff article includes a filamentous or other fine-diameter substrate element, the second metal-doped, oxidizable first metal coating of the invention is characterized by a radar signature which in the presence of moisture, e.g., atmospheric humidity, decays as a result of progressive oxidation of the first metal coating, with the rate of such oxidation being accelerated by the second metal constituent present on the exterior surface of the first metal coating.

In a broad method aspect, the present invention relates to a method of forming a fugitively conductive coating on a non-conductive substrate, comprising:

(a) depositing on the substrate a sub-micron thickness of an oxidizable first metal, to form a first metal-coated substrate; and (b) applying to the first metal-coated substrate a discontinuous coating of a second metal which promotes galvanic corrosion of the first metal.

In a further method aspect, the second metal-doped first metal-coated substrate formed by the method described in the preceding paragraph is further treated by application of a surface coating of a salt thereon.

Other aspects and features of the invention will be more fully apparent from the ensuing disclosure and appended claims.

DETAILED DESCRIPTION OF THE INVENTION, AND PREFERRED EMBODIMENTS THEREOF

Figure 1:
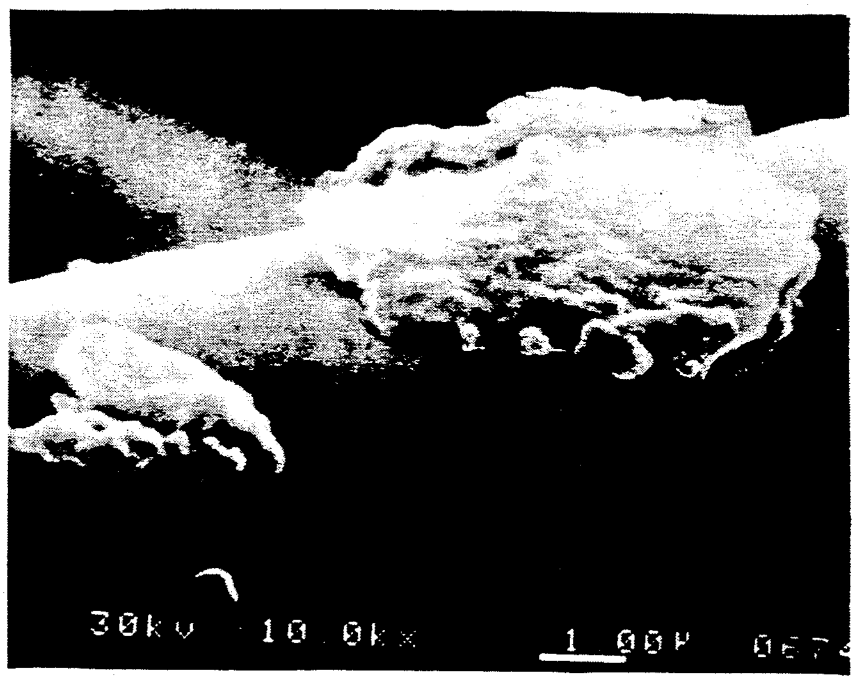
FIG. 1 is an electron photomicrograph, at magnification of 10,000 times, of an iron-coated glass filament having "islands" of copper deposited thereon.

The present invention relates broadly to an article comprising a non-conductive substrate having a sub-micron thickness of an oxidizable conductive first metal coating thereon, and a second metal which is galvanically effective to promote the corrosion of the first metal, discontinuously applied on the first metal coating. Preferably, the second (promoter) metal will be present on the first metal coating, in an amount of from about 0.1 to about 10% by weight of the total coating (first metal and second metal).

Although discussed primarily in the ensuing description in terms of chaff article applications, wherein the substrate element preferably is a small-diameter filament, the utility of the present invention is not thus limited, but rather extends to any other applications in which a temporary conductive coating is desired on a substrate.

Examples of other illustrative applications include moisture sensors, corrosivity monitors, moisture barrier devices, and the like.

Accordingly, the substrate may have any composition and may take any form which is suitable to the manufacturing conditions and end use environment of the product article.

For chaff applications, it is preferred that the substrate be in filamentous (i.e., fiber) form, however, other substrate forms, such as microbeads, microballoons, hollow fibers, powders, flakes, ribbons, and the like, may be employed.

For applications other than chaff, it may be necessary or desirable to provide the substrate element in bulk physical form, or alternatively in a finely divided, filamentous, or particulate form of the general types illustratively described above in connection with chaff articles according to the invention.

Irrespective of its physical form, the substrate element is non-conductive in character, and may be formed of any material which is appropriate to the processing conditions and end use applications of the product article. Illustrative substrate element materials of construction include glass, polymeric, ceramic, non-conductive carbon, and pre-oxidized carbon materials.

By "pre-oxidized carbon" is meant polyacrylonitrile fibers which have been heat stabilized.

Among the foregoing materials group, the classes of glasses and ceramics are preferred in most instances, especially chaff applications, due to their low cost and light weight. Oxide materials such as boria ($B_2O_3$) may be usefully employed in some applications. For chaff usage, boria has the advantage of being water soluble, whereby it can be dissipated by moisture.

Illustrative examples of potentially useful polymeric materials of construction for substrate elements include fibers of polyethylene, polyester, polyacrylonitrile, and polymeric fibers commercially available under the trademarks Kevlar® and Kynol®.

In chaff applications, the density of the substrate element material of construction preferably is less than about 2.9 grams per cubic centimeter, and most preferably is on the order of from about 1.3 to about 2.9 grams per cubic centimeter.

The most preferred materials of construction for chaff articles of the present invention are glasses, particularly oxide glasses, and more specifically silicate glasses. Silicate glasses have been advantageously employed in filamentous substrate elements in the practice of the present invention, and borosilicate, sodium silicate, calcium silicate, aluminosilicate, and aluminoborosilicate glasses may also be used to advantage.

In general, the glasses useful for substrate elements in chaff applications have a density on the order of from about 2.3 to about 2.7 grams per cubic centimeter.

When filamentous glass substrate elements are employed to form chaff articles in accordance with the present invention, the fiber diameter of the substrate element preferably is on the order of from about 0.5 to about 25 microns, and more preferably from about 2 to about 15 microns. It is believed that if the fiber diameter is decreased substantially below about 0.5 micron, the coated chaff fibers tend to become readily respirable, with a corresponding adverse effect on the health, safety, and welfare of persons exposed to such chaff. If, on the other hand, the diameter of the glass chaff fiber is increased substantially above 25 microns, the fiber tends to exhibit poor hang times, dropping too rapidly for effective utilization. These size constraints are dictated by the properties of the substrate material. Lower density fibers may be successfully employed in larger diameters.

Deposited on the substrate is a sub-micron thickness of an oxidizable conductive first metal coating, which may be formed of any suitable metal-containing composition which includes a metal which is oxidizable in character. Preferably, the oxidizable metal coating is formed of a metal selected from the group consisting of iron, nickel, copper, zinc, tin, and combinations (i.e., alloys, mixtures, eutectics, etc.) of such metals with each other or with other (metallic or non-metallic) constituents.

"Sub-micron thickness" is defined as an applied thickness of less than 1.0 micron. Consistent with the objective of the invention to provide a conductive coating on the substrate which is rapidly rendered non-conductive by oxidation thereof, the thickness of the first metal coating should not exceed 1.0 micron. Further, it has been found that at first metal coating thicknesses above about 1.0 micron, metal coated filaments in chaff applications tend to stick or adhere to one another, particularly when the chaff is provided in the form of multifilament tows, which typically may contain on the order of about 200 to about 50,000 filaments per tow, and preferably from about 1,000 to about 12,000 filaments per tow. Additionally, it has been found that at a first metal coating thickness significantly above 1.0 micron, differential thermal effects and/or deposition stresses tend to adversely affect the adhesion of the metal film to the substrate element, with consequent increase in the tendency of the first metal film on the coated article to chip or otherwise decouple.

In chaff applications utilizing filamentous substrate elements, the conductive first metal coating thickness may suitably be on the order of 0.002 micron to about 0.25 micron, with a thickness range of from about 0.025 micron to about 0.10 micron being typically preferred. Disproportionately lower film thicknesses of the first metal coating result in discontinuities which adversely affect the desired conductivity characteristics of the applied first metal coating.

The oxidizable conductive first metal coating may comprise any of various suitable metals, such as iron, copper, tin, nickel, and zinc, or oxidizable alloys thereof. Preferably, the conductive first metal coating is iron due to its ease of oxidation, low toxicity, and low cost.

To achieve the desired sub-micron thicknesses of the first metal coating on the substrate, it is preferred in practice to utilize chemical vapor deposition processes to deposit elemental metal on the substrate from an organometallic precursor material, although any other process techniques or methods which are suitable and efficacious to deposit the first metal coating in the desired thickness (such as solution plating) may be usefully employed. When the preferred first metal, iron, is employed, the metal may be deposited by chemical vapor deposition utilizing an organoiron precursor material, such as iron carbonyls or ferrocene (bis(cyclopentadienyl)iron).

It will be recognized, however, that the specific substrate element material of construction must be selected to retain the substrate element's desired end-use characteristics during the coating operation, as well as during the subsequent treatment steps. Accordingly, when chemical vapor deposition is employed to deposit an oxidizable metal, e.g., iron, on the substrate, temperatures in the range of 90° C.–800° C. can be involved in respective steps of the coating process. Oxidizable metal application temperatures are dictated by the thermal carrying properties and thermal stability of the substrate. Thus, these properties of the substrate can determine the properties of the deposited film. Accordingly, a substrate material accommodating a range of processing temperatures is preferred, e.g., glass or ceramic.

As an example of the utilization of chemical vapor deposition to deposit an elemental iron coating on a substrate material, the substrate element may be a borosilicate glass fiber with a diameter on the order of 3–8 microns. Such fibers may be processed in a multizone chemical vapor deposition (CVD) system including a first stage in which the substrate filament is desized to remove epoxy or starch size coatings, at a temperature which may be on the order of 650° C.–800° C. and under an inert or oxidizing atmosphere. Following desizing, the clean filament may be conducted at a temperature of 450° C.–600° C. into a coating chamber of the CVD system. In the coating chamber, the hot filament is exposed to an organometallic precursor gas mixture, which in the case of the preferred first metal species, iron, may comprise iron pentacarbonyl as the iron precursor compound, at a concentration of 5–50% by weight in a carrier gas such as hydrogen. This source gas mixture may be at a temperature on the order of 75° C.–150° C. in the coating chamber, whereby elemental iron is deposited on the substrate element from the carbonyl precursor compound. The coating operation may be carried out with repetition of the heating and coating steps in sequence, to achieve a desired film thickness of the applied iron coating.

It will be appreciated that the foregoing description of coating of the non-conductive substrate with iron is intended to be illustrative only, and that in the broad practice of the present invention, other CVD iron precursor compound gas mixtures may be employed, e.g., ferrocene in a hydrogen carrier gas. Alternatively, other non-CVD techniques may be employed for depositing the oxidizable metal on the substrate, such as solution plating.

Subsequent to application to the substrate of a conductive first metal coating of the desired thickness, the first metal-coated substrate is coated or "doped" with a discontinuous coating of a second metal, sometimes hereinafter referred to as a "promoter metal," which is galvanically effective to promote the corrosion of the oxidizable first metal coating. The second metal coating is discontinuous in character, in that the second metal coating does not fully cover or occlude the conductive first metal coating on the non-conductive substrate. As a result of the exposure of the oxidizable first metal coating "through" the discontinuous second metal coating to the ambient environment, the conductive first metal coating is converted by atmospheric moisture to a non-conductive metal oxide film.

Such oxidation or corrosion of the conductive first metal film is galvanically assisted and accelerated by the discontinuous coating of the second metal which is superposed on the oxidizable first metal coating.

The second metal discontinuously coated on the oxidizable, conductive first metal coating in the broad practice of the present invention may include any suitable metal which is galvanically effective to promote the corrosion of the first metal in the oxidizable conductive first metal coating on the non-conductive substrate. As used in such context, the term "metal" is to be broadly construed to include elemental metal, as well as alloys, intermetallics, composites, or other materials containing a corrosion promotingly effective second metal constituent.

In order for the second metal to effectively promote galvanic corrosion of a conductive first metal film, and assist in the oxidation of the first metal film, the second metal must have a lower standard oxidization potential than the first metal, thereby enabling the second metal to act as a cathodic constituent in the galvanic corrosion reaction. Illustrative of elemental second metals which may be potentially usefully employed in the broad practice of the present invention are cadmium, cobalt, nickel, tin, lead, copper, mercury, silver, and gold. In general, the lower the oxidation potential, $E^0$, the faster is the reduction-oxidation corrosion reaction.

Of the above-listed exemplary elemental metals useful in the broad practice of the present invention, and with preference to iron as the oxidizable conductive first metal species, copper is typically a preferred elemental second metal, due to its low toxicity, low cost, and low oxidation potential.

The application or formation of the discontinuous coating of second metal on the oxidizable conductive first metal coating may be carried out in any suitable manner, such as flame spraying, low rate precipitation in a plating bath, or other surface application methods. It is also within the broad purview of the present invention to provide a continuous coating of the second metal on the substrate first metal film, and to thereafter preferentially etch or attack the continuous second metal film to render same discontinuous in character. Further, it is possible to form the discontinuous second metal coating on the oxidizable conductive first metal film by in situ chemical reaction, wherein the reaction product comprises a second metal species which is effective to galvanically accelerate the corrosion of the oxidizable first metal film under ambient exposure conditions in the presence of atmospheric moisture.

In general, however, it is preferred to achieve a discontinous deposition of the second metal on the first metal-coated substrate by chemical vapor deposition techniques, utilizing as the precursor material for the second metal an organometal compound whose metallic moiety is the second metal. The specific concentrations and concentration ranges which are suitable to form discontinous second metal films from a given organometal precursor material will be readily determinable by those of ordinary skill in the art, without undue experimentation.

As indicated, for iron-coated substrates, copper is typically a most preferred second metal species, in the broad practice of the present invention. Tin is also preferred and, to a lesser extent, nickel, although nickel may be unsatisfactory in some applications due to toxicity considerations, depending on the ultimate end use.

For the aforementioned most preferred copper second metal species, when iron is the first metal species, application of the discontinuous coating of copper to the iron-coated substrate by chemical vapor deposition techniques may utilize copper hexafluoroacetylacetonate as an organocopper precursor compound for elemental copper deposition. In the chemical vapor deposition process, the gas-phase concentration of this organocopper precursor compound is maintained at a suitably low level, e.g., not exceeding about 200 grams per cubic centimeter of the vapor (carrier gas and volatile organometal precursor compound), and typically much lower, such as for example 0.001 gram per cc. By maintaining the vapor-phase concentration of the second metal precursor compound suitably low, the discontinuous coating of the second metal is achieved. For example, at the aforementioned concentration of 0.001 gram of copper hexafluoroacetylacetonate per cubic centimeter of vapor mixture in the chemical vapor deposition chamber, it is possible to form localized discrete deposits, e.g., "islands," of the second metal derived from the organometal precursor compound.

The choice of a specific organometallic precursor compound for the second metal may be suitably varied, depending on the chemical vapor deposition process conditions, metal constituent, character of the oxidizable first metal-coated substrate, etc., as will be apparent to those skilled in the art. In the case of tin as a second metal species, a suitable organometallic precursor compound is tetramethyl tin.

Subsequent to application to the conductive first metal-coated substrate of a discontinuous film of second ("promoter") metal, the second metal-doped, first metal-coated substrate may optionally be further coated or "doped" with a suitable amount, for example from about 0.005% to about 25% by weight, based on the weight of first metal in the oxidizable conductive first metal coating, of a salt on the external surface of the oxidizable first metal coating. The salt may include as potentially useful salt species metal salts (e.g., halides, nitrates, sulfates, etc.) as well as organic salts (e.g., citrates, stearates, acetates, etc.), the choice of a specific salt being readily determinable by simple corrosion tests without undue experimentation. It will likewise be appreciated that the type and amount, or "loading," of the salt may be widely varied as necessary or desirable to correlatively provide a predetermined service life for the oxidizable metal under corrosion conditions in the specific end-use environment in which the product article is to be deployed.

Since it is desired that the conductive first metal coating be retained in an oxidizable state, the first metal-coated substrate suitably is processed in the second metal application, optional salt application, and any succeeding treatment steps, under an inert or other non-oxidizing atmosphere.

The optional salt coating of the second metal-doped, first metal-coated substrate advantageously may be carried out by passage of the second metal-doped, first metal-coated substrate through a reaction zone for exposure to a halogenating gas such as chlorine, or alternatively, a bath containing a solution of the salt, or in any other suitable manner, effecting the application of the salt to the external surface of the second metal-doped, first metal-coated article. Generally, however, solution bath application of the salt is preferred, and for such purpose the bath may contain a low concentration of salt in any suitable solvent. Preferably, the solvent is anhydrous in character, to minimize premature oxidation of the first metal. Alkanolic solvents are generally suitable, such as methanol, ethanol, and propanol, and such solvents are, as indicated, preferably anhydrous in character. The salt may be present in the solution at any suitable concentration, however it is generally satisfactory to utilize a maximum of about 25% by weight of the salt, based on the total weight of the salt solution.

Any suitable salt may be employed in the salt solution bath, although metal halide salts and metal sulfate salts are preferred. Among metal halide salts, the halogen constituent preferably is chlorine, although other halogen species may be utilized to advantage. Examples of suitable metal halide salts include lithium chloride, sodium chloride, zinc chloride, and iron (III) chloride. A preferred metal sulfate species is copper sulfate, $CuSO_4$. Broadly, from about 0.005% to about 25% by weight of metal salt, based on the weight of first metal in the oxidizable first metal coating, may be applied to the first metal coating, with from about 0.05% to about 20% by weight of metal salt being preferred, and from about 0.10% to about 15% by weight being most preferred (all precentages of salt being based on the weight of first metal in the first metal coating on the substrate element).

Among the aforementioned illustrative metal chlorides, iron (III) chloride is a most preferred salt. It is highly hygroscopic in character, binding six molecules of water for each molecule of iron chloride in its most stable form. Iron (III) chloride has the further advantage that it adds Fe (III) to the metal-coated fiber to facilitate the ionization of the oxidizable first metal. For example, in the case of iron as the oxidizable metal on the non-metallic substrate, the presence of Fe (III) facilitates the ionization of Fe (0) to Fe (II). Additionally, iron (III) chloride is non-toxic in character. Copper sulfate is also a preferred salt dopant material since the copper cation functions to galvanically facilitate the ionization of elemental iron, enhancing the rate of corrosion of the iron film when iron is employed as the oxidizable first metal.

When the salt dopant is applied from a solution bath, or otherwise from a salt solution, the coated substrate after salt solution coating is dried, such as by passage through a drying oven, to remove solvent from the applied salt solution coating, and yield a dried salt coating on the exterior surface of the second metal-doped, first metal-coated film. The temperature and drying time employed in the solvent removal operation may be readily determined by those skilled in the art without undue experimentation, as appropriate to yield a dry salt coating on the second metal-doped, first metal-coated substrate article. When alkanolic solvents are employed, the drying temperature generally may be on the order of about 100° C.

After salt coating of the second metal-doped, first metal-coated substrate, and drying to effect solvent removal from the applied salt coating when the salt is applied from a solvent solution, the resulting salt-modified, second metal-doped, first metal-coated substrate product article is hermetically sealed for subsequent use.

It is to be recognized that the salt modification of the second metal-doped, first metal-coated substrate is not required in the broad practice of the present invention, but is an optional additional coating treatment which may be carried out to further enhance the oxidation of the conductive first metal film on the substrate during the galvanically accelerated corrosion of the first metal coating resulting from the presence of the second metal thereon.

As indicated, during the processing of the substrate subsequent to application of the conductive first metal coating thereto, the resulting first metal-coated substrate preferably is processed under an inert or otherwise non-oxidizing atmosphere, to preserve the oxidizable character of the first metal-coated film. Thus, the second metal coating, and optional salt coating, drying, and packaging steps may be carried out under a non-oxidizing atmosphere such as nitrogen. In the final packaging step, the second metal-doped, first metal-coated substrate may be disposed in a package, chamber, housing, or other end use containment means, for storage pending use thereof, with a non-oxidizing environment being provided in such containment means. Accordingly, the final product article may be stored in the containment means under nitrogen, hydrogen or other non-oxidizing atmosphere, or in a vacuum, or otherwise in an environment substantially devoid of oxygen or other oxidizing species or constituents which may degrade the oxidizable conductive first metal coating or otherwise affect its utility for its intended end use.

Depending on the type and character of the substrate element, it may be desirable to treat the substrate article in order to enhance the adhesion thereto of the conductive first metal coating. For example, as described above concerning the usage of glass filament as the substrate element, it may be necessary or desirable to desize the glass filament when same is initially provided with a size or other protective coating, such as an epoxy, silane, or amine size coating, by heat treatment of the filament. More generally, it may be desirable to chemically or thermally etch the substrate surface, such as by acid exposure or flame spray treatment. It may also be desirable to employ a primer or adhesion promoter coating or other interlayer on the substrate to facilitate or enhance the adhesion of the first metal coating to the substrate. Specifically, it may be desirable in some instances, particularly when the substrate element is formed of materials such as glasses, ceramics, or hydroxy-functionalized materials, to form an interlayer on the substrate surface comprising a material such as polysilicate, titania, and/or alumina, using a sol gel application technique, as is disclosed and claimed in U.S. Pat. No. 4,738,896 issued Apr. 19, 1988 to W. C. Stevens for "SOL GEL FORMATION OF POLYSILICATE, TITANIA, AND ALUMINA INTERLAYERS FOR ENHANCED ADHESION OF METAL FILMS ON SUBSTRATES." The disclosure of this patent hereby is incorporated herein by reference.

It may also be necessary or desirable in the broad practice of the present invention to treat or process the first metal-coated substrate to enhance the adhesion of the discontinuous coating of the second metal to the conductive first metal coating on the substrate.

Referring now to the drawings, FIG. 1 is an electron photomicrograph, at a magnification of 30,000 times, of a copper-coated, iron-coated glass filament. The coated article comprises an oxidizable iron coating on the exterior surface of the substrate glass filament, with a discontinuous coating of copper on the oxidizable iron coating. The discontinuous copper coating, as shown, has the form of "islands" on the iron coating.

The scale of the electron photomicrograph of FIG. 1 is shown by the line in the right central portion at the bottom of the photograph, representing a distance of 1 micron.

The glass filament employed in the coated fiber shown in FIG. 1 was of lime aluminoborosilicate composition, commercially available as E-glass (Owens-Corning D filament (54% $SiO_2$; 14.0% $Al_2O_3$; 10.0% $B_2O_3$; 4.5% MgO; and 17.5% CaO)) having a measured diameter of 4.8 microns. This glass filament was coated with an iron coating at a thickness of about 0.075 micron, and as shown in FIG. 1, the copper islands on the iron film had dimensions in the range of 1–10 microns, as measured along the surface of the iron coating on which the islands were deposited. Both the iron coating and the copper islands on the coated fiber shown in FIG. 1 were applied by chemical vapor deposition techniques.

Figure 2:
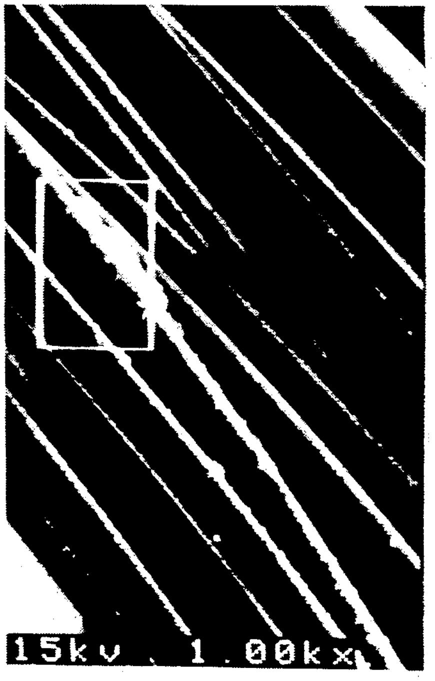
FIG. 2 is an electron photomicrograph, at magnification of 30,000 times, of a tow of salt-doped, copper-coated iron-coated glass fibers in accordance with one embodiment of the present invention.

FIG. 2 shows a tow of fibers of copper-coated, iron-coated glass filaments similar to the coated filaments shown in FIG. 1, but on which the copper coating was relatively more continuous than the copper "islands" of the coated filament shown in FIG. 1. The tow shown in FIG. 2 comprised filaments of copper-coated, iron-coated glass fibers, which were doped with salt by depositing approximately 1.8% by weight iron (III) chloride (based on the weight of iron in the oxidizable film) on the copper-coated, iron-coated glass fibers, from a 0.25% by weight solution of iron (III) chloride in methanol.

Figure 3:
FIG. 3 is an enlargement of the demarcated rectangular area shown in the left central portion of the electron photomicrograph of FIG. 2.

FIG. 3 is an enlargement of the demarcated rectangular portion of the electron photomicrograph of FIG. 2, showing the presence of salt crystallites on the copper-coated, iron-coated glass fibers.

Figure 4:
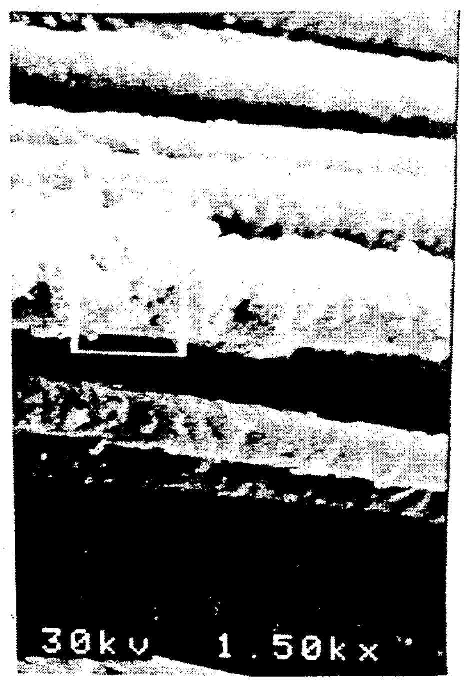
FIG. 4 is an electron photomicrograph, at a magnification of 1500 times, of a tow of fibers of the type shown in FIG. 2, after exposure to 52% relative humidity conditions at 25° C. for 20 hours.
Figure 5:
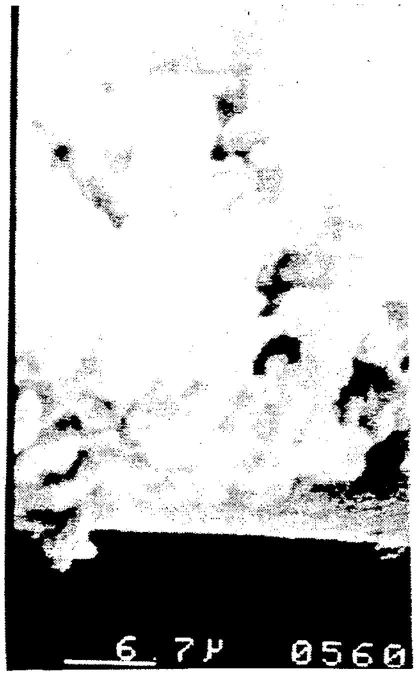
FIG. 5 is an enlargement of the rectangular demarcated area of the FIG. 4 photomicrograph.

FIG. 4 is an electron photomicrograph, at magnification of 1500 times, of a tow of fibers corresponding to those shown in FIG. 2, after exposure of the tow to 52% relative humidity conditions at 25° C. for 20 hours. The corrosion of the iron coating on the fibers is dramatically evident from this photograph, an enlargement of the demarcated rectangular portion of which is shown in FIG. 5.

Figure 6:
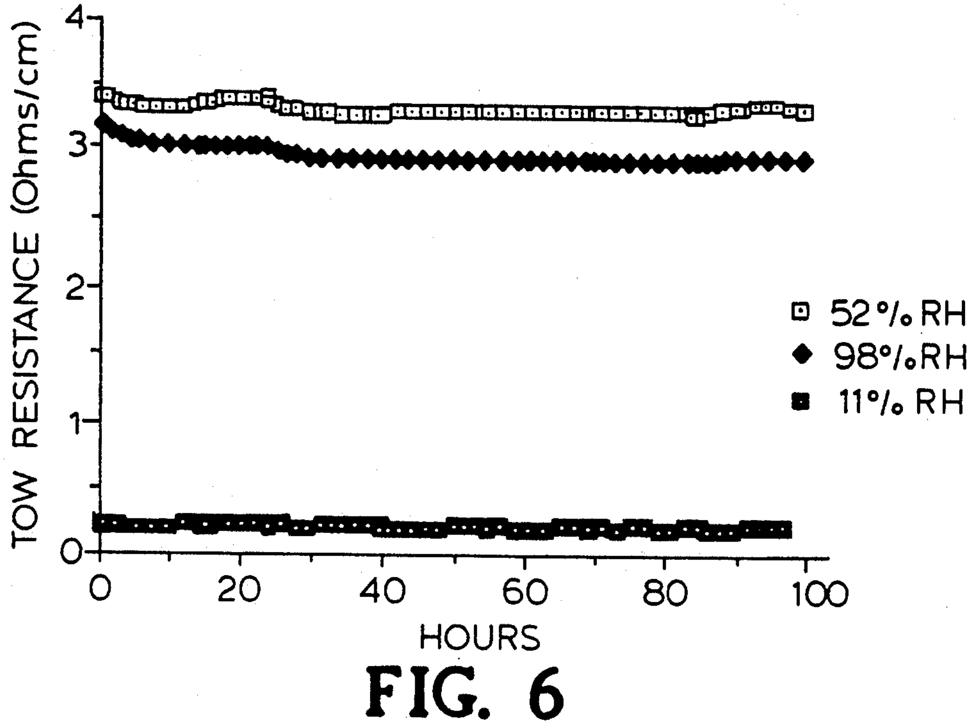
FIG. 6 is a graph of tow resistance, in Megaohms/cm., as a function of exposure time, in hours, for a tow of iron-coated glass fibers discontinuously coated with copper, in 11%, 52%, and 98% relative humidity environments.

FIG. 6 is a graph of resistance, in Megaohms, as a function of exposure time, in hours, for fiber tows which comprised 6 micron nominal diameter (4.8 micron measured diameter) glass filaments as the substrate elements, on which were coated a 0.075 micron thickness of iron film, and then a relatively continous coating of copper.

As indicated in FIG. 6, corresponding tows were exposed at 11%, 52%, and 98% relative humidity exposure conditions, and the resistance of the tow, in ohms/cm., was measured during the time of exposure. The results shown in FIG. 6 demonstrate that tow resistance remained substantially constant with time, when the copper coating was substantially continuous in character.

Figure 7:
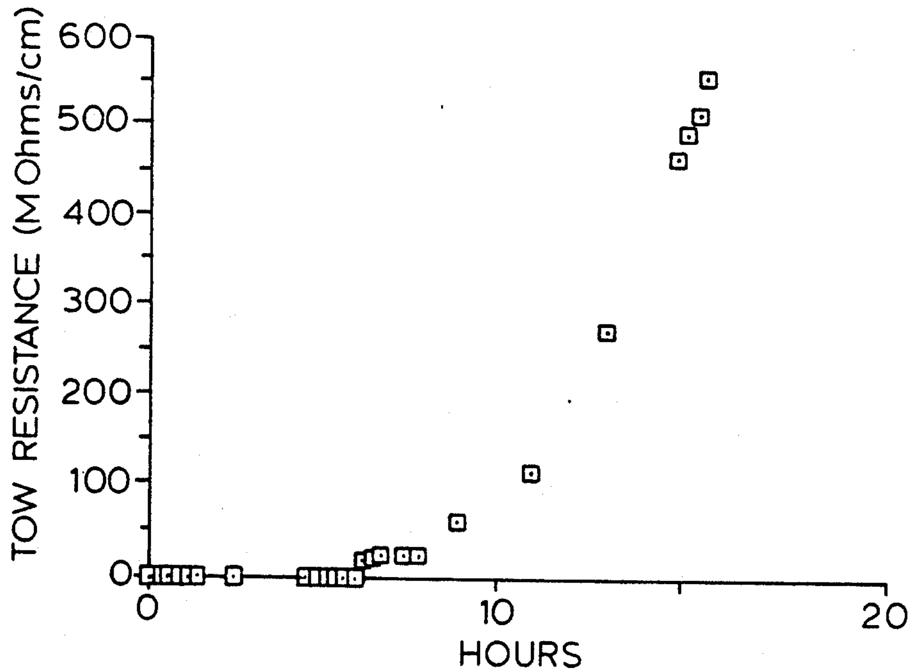
FIG. 7 is a graph of tow resistance, in Megaohms/cm., as a function of exposure time, in hours, for a salt-doped, copper on iron-coated glass fiber, at 52% relative humidity conditions.

FIG. 7 is a graph of tow resistance, in Megaohms/cm., as a function of exposure time, in hours, for a tow of fibers comprising 6 micron nominal diameter (4.8 microns measured diameter) glass filaments having a 0.075 micron thick iron coating deposited thereon, and coated with a discontinous film of copper, and doped with iron (III) chloride salt.

The data plotted in FIG. 7 show that tow resistance remained negligible for approximately five hours, followed by a rapid exponential increase in resistance, indicative of rapid oxidation of the oxidizable iron coating. The conductivity of this fiber tow sample was fully decayed in about 15 hours.

Figure 8:
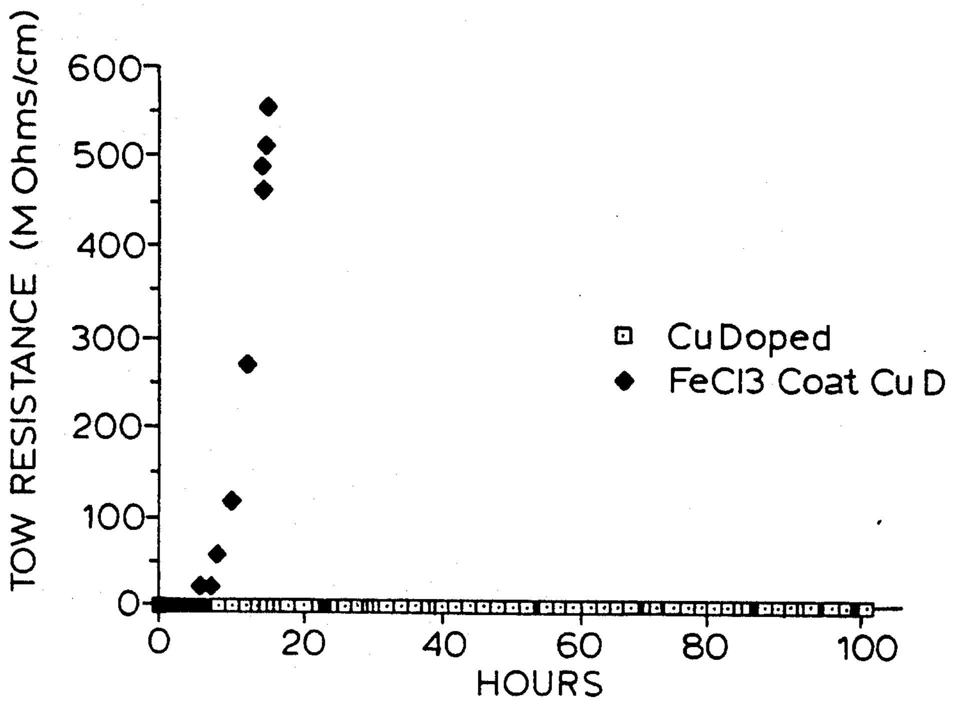
FIG. 8 is a graph of tow resistance, in Megaohms/cm., as a function of exposure time, in hours, for a tow of copper on iron-coated glass fibers, and for a corresponding tow having iron (III) chloride salt doped thereon, in a 52% relative humidity environment.

FIG. 8 is a graph of tow resistance, in Megaohms/cm., as a function of exposure time, in hours, to 52% relative humidity conditions, for a fiber tow of the type employed to generate the data of FIG. 6 ("Cu Doped"), and a corresponding fiber tow of the type employed to generate the data of FIG. 7 ("FeC13 Coat Cu D"). The data of FIG. 8 show that the copper-coated, iron-coated fibers on which the copper coating was substantially continuous in character, exhibited a substantially negligible resistance over the full exposure period, while the corresponding salt-doped fiber tow exhibited substantially constant resistance for about eight hours, after which its resistance rapidly increased.

These data show that even where the copper coating on the iron coating is substantially continuous, and would otherwise prevent significant oxidization of the iron coating, the presence of the metal salt, which acts as an electrolyte, nonetheless initiates corrosion of the underlying iron film.

Figure 9:
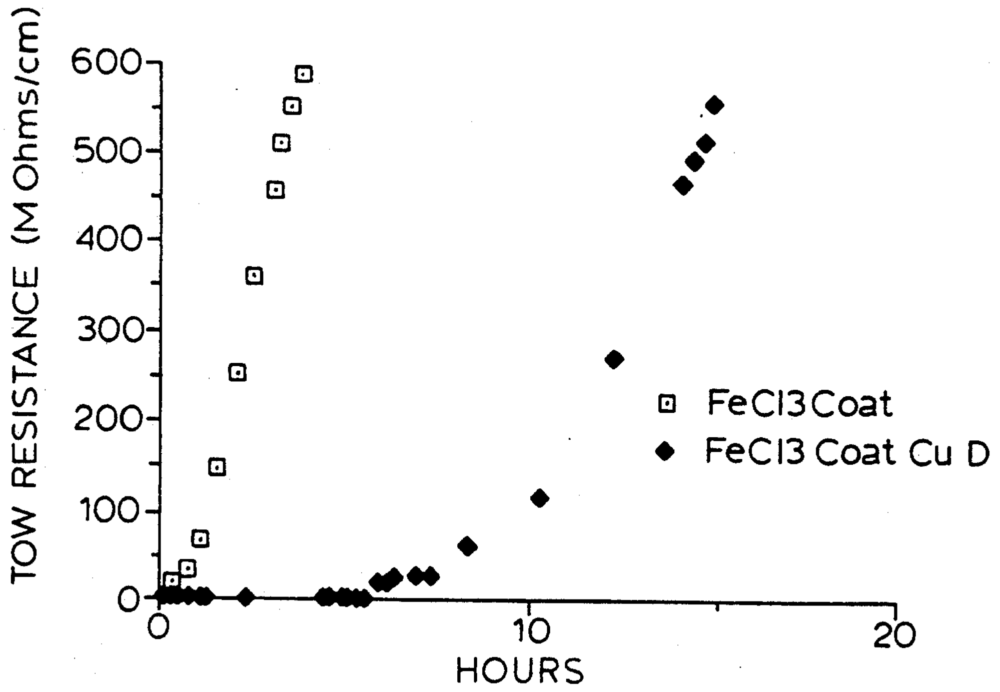
FIG. 9 is a graph of tow resistance, in Megaohms/cm., as a function of exposure time, in hours, for a tow of salt-doped, copper on iron-coated glass filaments, and for a corresponding filament tow devoid of any copper thereon, in a 52% relative humidity environment.

FIG. 9 is a graph of tow resistance, in Megaohms/cm., as a function of exposure time, in hours, at 52% relative humidity exposure conditions. The tows which were evaluated comprised fibers of 6 micron nominal diameter (4.8 measured diameter) coated with a 0.075 micron thickness of iron thereon. A first tow was doped with iron (III) chloride salt; this tow was designated "FeC13 Coat." The other tow utilized a same iron-coated fiber, on which was coated copper and iron (III) chloride salt; this tow was designated as "FeC13 Coat CuD."

The results in FIG. 9 show that the salt-doped, iron-coated glass fiber tow began to rapidly oxidize within thirty minutes or so of initial exposure to 52% relative humidity conditions. The corresponding salt-doped, copper-coated, iron-coated fiber tow exhibited negligible resistance for approximately 8 hours, followed by rapidly increasing resistance, indicative of high rate oxidation of the iron film.

From the foregoing, it is seen that the rate of oxidation of an iron film coated with a discontinous coating of promoter metal, and optionally with a metal salt coating, may be selectively adjusted over a wide range to achieve a predetermined conductive life and a selected rate of decay of such conductivity. Where the copper coating is relatively continuous in character, it is highly desirable to utilize a further coating of metal salt to accelerate the galvanic corrosion reaction by which the iron film on the substrate fiber is oxidized and rendered non-conductive in character.

In the above-described tow resistance tests, the data from which are shown in FIGS. 6–9, the tow resistance was determined by the following method.

In order to measure the tow resistance of the respective fiber tows, each tow was mounted on a copper contact circuit board with a known spacing, in either a two-point or four-point arrangement. Electrical contact was assured through use of conductive silver paint. Fiber tows were analyzed by the use of a digital multimeter. A known voltage was applied across the fiber circuit. The resulting current was metered and the resistance computed. This measurement was repeated periodically over the fiber lifetime of interest, with voltage applied, during each interval, for a duration just long enough to allow measurement to be made. The increase in resistance over time then is plotted as an indicator of decay rate and conductive lifetime.

Thus, the life of the conductive first metal coating may be controllably adjusted by the discontinuous coating of a second ("promoter") metal and optionally by selectively doping salt on the surface of the promoter metal-doped first metal coating. In chaff applications, the respective coating levels may be utilized to correspondingly adjust the service life of the first metal-coated chaff fibers, consistent with a desired retention of the initial radar signature characteristic thereof for a given length of time, followed by rapid dissipation of the radar signature character of such "evanescent chaff" material.

In some instances in which the promoter metal-doped, first metal-coated substrate is subjected to contact with other coated articles or otherwise to abrasion prior to actual deployment, it may be desirable to overcoat the promoter metal-doped, first metal-coated substrate with a material serving as a fixative for the promoter metal (and optional salt coating), to prevent damage to the promoter metal and/or salt coating as a result of abrasion or other contacts which would otherwise serve to remove the applied promoter metal and/or salt coatings. For example, a porous gel coating or binder material may be applied to the promoter metal-coated, oxidizable first metal-doped film, for the purpose of adheringly retaining the promoter metal coating in position on the conductive first metal film. The overcoat may generally be of any suitable material which does not adversely affect the respective promoter metal and conductive first metal coatings for the intended purpose of the coated product article. A preferred overcoat material comprises polysilicate, titania, and/or alumina, formed on the promoter-doped, conductive first metal film from a sol gel dispersion of polysilicate, titania, and/or alumina material, as more fully disclosed and claimed in our copending U.S. application Ser. No. 07/449,695 filed Dec. 11, 1989 in the names of Ward C. Stevens, Edward A. Sturm and Bruce C. Roman for "CHAFF FIBER COMPRISING INSULATIVE COATING THEREON, AND HAVING AN EVANESCENT RADAR REFLECTANCE CHARACTERISTIC, AND METHOD OF MAKING THE SAME", hereby incorporated herein by reference.

As used herein, the term "oxidizable metal" is to be broadly construed to include elemental oxidizable metals per se, and combinations of any of such elemental metals with each other and/or with other metals, and including any and all metals, alloys, eutectics, and intermetallic materials containing one or more of such elemental oxidizable metals, and which are depositable in sub-micron thickness on a substrate and subsequent to such deposition are oxidizable in character.

Although iron is a preferred oxidizable metal in the practice of the present invention, and the invention has been primarily described herein with reference to iron-coated glass filaments, it will be recognized that nickel, copper, zinc, and tin, as well as other metals, may be potentially usefully employed in similar fashion. It will also be recognized that the substrate element may be widely varied, to comprise the use of other substrate element conformations and/or materials of construction.

In the use of nickel, copper, zinc, and tin as oxidizable first metal constituents, the preferred salt dopant species, and promoter metals, may vary from those described above, which are disclosed as being applicable to the invention and preferred in application to iron. With regard to salt dopant materials, in the context of the broad range of preferred oxidizable first metal constituents (iron, nickel, copper, zinc, and/or tin) of the present invention, metal halides, particularly those in which the halide moiety is chlorine, are considered to be a preferred class of salt dopant materials.

The features and advantages of the present invention are more fully shown with reference to the following non-limiting examples, wherein all parts and percentages are by weight, unless otherwise expressly stated.

EXAMPLE I

A calcium aluminoborosilicate fiberglass roving material (E-glass, Owens-Corning D filament) comprising glass filaments having a measured diameter of 4.8 microns and a density of 2.6 grams per cubic centimeter, were desized under nitrogen atmosphere to remove the size coating therefrom, at a temperature of approximately 700° C. Following desizing, the filament roving at a temperature of approximately 500° C. was passed through a chemical vapor deposition chamber maintained at a temperature of 110° C. The chemical vapor deposition chamber contained 10% iron pentacarbonyl in a hydrogen carrier gas. The fiber roving was passed through heating and coating deposition zones in sequence, for a sufficient number of times to deposit a coating of elemental iron at approximately 0.075 micron thickness on the fiber substrate of the roving filaments.

Subsequent to iron coating, the roving was passed through a chemical vapor deposition chamber to which a gas stream of approximately 50–80% by weight copper hexafluoroacetylacetonate in hydrogen carrier gas was supplied, resulting in deposition of copper islands whose dimensional size characteristics, as measured along the surface of the iron coating, were in the range of from about 0.5 to about 10 microns. The resulting copper-coated, iron-coated roving then was packaged under nitrogen atmosphere in a moisture-proof package.

EXAMPLE II

In this example, an oxidizable iron coating was applied to a silicate fiberglass roving material, and then coated with a discontinous coating of copper, as described in Example I. Subsequent to the formation of deposited copper islands on the iron coating, the roving was passed through a solution bath containing 2% by weight of iron (III) chloride in methanol solution, under nitrogen atmosphere. The roving then was passed through a drying oven at a temperature of approximately 100° C. under nitrogen atmosphere, to remove the methanol solvent and leave a salt coating of iron (III) chloride on the copper-coated, iron-coated substrate. The salt-doped, copper-coated, iron-coated roving then was packaged under nitrogen atmosphere in a moisture-proof package.

While preferred and illustrative embodiments of the invention have been described, it will be appreciated that numerous modifications, variations, and other embodiments are possible, and accordingly, all such modifications, variations, and embodiments are to be regarded as being within the spirit and scope of the present invention.

What is claimed is:

1. A method of forming on a non-conductive substrate a conductive coating which in exposure to atmospheric moisture is oxidized so that the conductive coating is rendered non-conductive by oxidation thereof, said substrate comprising a material selected from the group consisting of glasses, polymers, and ceramic materials, and said method comprising:

(a) depositing on the substrate a continuous coating of a sub-micron thickness of an oxidizable conductive first metal to form a first metal-coated substrate; and (b) applying to the first metal-coated substrate a discontinuous coating of a second metal which is galvanically effective to promote the corrosion of the first metal coated on the substrate in exposure to said atmospheric moisture, to form a second metal-doped, first metal-coated substrate wherein in exposure to said atmospheric moisture the conductive first metal coating is oxidized to a non-conductive state and the oxidation is galvanically promoted by the second metal discontinuously coated on the first metal coating.

2. A method according to claim 1, wherein the second metal is present on the first metal coating at a concentration of from 0.1 to about 10% by weight, based on the weight of first metal coated on the substrate.

3. A method according to claim 1, wherein the second metal is present on the first metal coating at a concentration of from 0.5 to about 5% by weight, based on the weight of first metal coated on the substrate.

4. A method according to claim 1, wherein the first metal comprises iron, and is deposited on the substrate by chemical vapor deposition from a precursor comprising iron pentacarbonyl.

5. A method according to claim 1, wherein the non-conductive substrate is made of a glass material.

6. A method according to claim 1, wherein the non-conductive substrate is made of a material selected from the group consisting of borosilicate glasses, calcium silicate glasses, sodium silicate glasses, aluminosilicate glasses, and aluminoborosilicate glasses.

7. A method according to claim 1, wherein the non-conductive substrate is in the form of a filament.

8. A method according to claim 7, wherein the filament has a diameter of from about 0.5 to about 25 microns.

9. A method according to claim 1, wherein the first metal coating comprises a metal selected from the group consisting of iron, copper, tin, nickel, zinc, and combinations thereof.

10. A method according to claim 1, wherein the oxidizable conductive first metal coating has a thickness of from about $2\times10^{-3}$ to about 0.25 microns.

11. A method according to claim 1, wherein the second metal is copper.

12. A method according to claim 1, wherein the first metal comprises iron and the second metal comprises copper.

13. A method according to claim 1, wherein the second metal is selected from the group consisting of cadmium, cobalt, nickel, tin, lead, copper, mercury, silver, and gold.

14. A method according to claim 1, wherein the second metal comprises copper.

15. A method of forming on a non-conductive substrate a conductive coating which in exposure to atmospheric moisture is oxidized so the conductive coating is rendered non-conductive by oxidation thereof, said substrate comprising a material selected from the group consisting of glasses, polymers, and ceramic materials, and said method comprising:

(a) depositing on the substrate a continuous coating of a sub-micron thickness of an oxidizable conductive first metal, to form a first metal-coated substrate; and (b) applying to the first metal-coated substrate a discontinuous coating of a second metal which is galvanically effective to promote the corrosion of the first metal coated on the substrate in exposure to said atmospheric moisture to form a second metal-doped, first metal-coated substrate; and (c) applying to the second metal-doped, first metal-coated substrate a salt at a concentration of from about 0.005% to about 25% by weight of the salt, based on the weight of the first metal on the substrate, to form a salt-modified, second metal-doped, first metal-coated substrate.

16. A method according to claim 15, wherein the salt is applied by contacting of the second metal-doped, first metal-coated substrate with a solvent solution of the salt, to form a salt solution-modified, second metal-doped, first metal-coated substrate, and drying the salt solution-modified, second metal-doped, first metal-coated substrate to remove the solvent from the salt solution, to yield the salt-modified, second metal-doped, first metal-coated substrate article.

17. A method according to claim 16, wherein the salt solution comprises an alkanolic solvent.

18. A method according to claim 16, wherein the salt solution comprises an anhydrous solvent.

19. A method according to claim 15, wherein the salt is selected from the group consisting of metal halides, metal sulfates, metal nitrates, and organic salts.

* * * * *